(12) United States Patent
Souilmi

(10) Patent No.: US 8,412,491 B2
(45) Date of Patent: Apr. 2, 2013

(54) SYSTEM AND METHOD FOR ELECTRIC PATTERNS DISCOVERY

(75) Inventor: Younes Souilmi, Antibes (FR)

(73) Assignee: Accenture Global Services Limited, Dublin (IE)

( * ) Notice: Subject to any disclaimer, the term of this patent is extended or adjusted under 35 U.S.C. 154(b) by 326 days.

(21) Appl. No.: 12/847,678

(22) Filed: Jul. 30, 2010

(65) Prior Publication Data

US 2011/0046904 A1 Feb. 24, 2011

(30) Foreign Application Priority Data

Aug. 24, 2009 (EP) .................................... 09305779

(51) Int. Cl.
*G06F 15/00* (2006.01)
*G05D 9/00* (2006.01)
(52) U.S. Cl. ........................................ 702/188; 700/291
(58) Field of Classification Search .................. 702/188, 702/62; 700/291, 295
See application file for complete search history.

(56) References Cited

U.S. PATENT DOCUMENTS

| | | | |
|---|---|---|---|
| 4,347,575 A * | 8/1982 | Gurr et al. ..................... | 700/295 |
| 4,858,141 A | 8/1989 | Hart et al. | |
| 5,717,325 A | 2/1998 | Leeb et al. | |
| 2008/0177678 A1 | 7/2008 | Di Martini et al. | |

FOREIGN PATENT DOCUMENTS

WO    WO 2007/139587    6/2007

OTHER PUBLICATIONS

Hart, G.W., "Nonintrusive Appliance Load Monitoring", Proceedings of the IEEE, IEEE, New York, US, vol. 80, No. 12, Dec. 1, 1992, pp. 1870-1891, XP000336363 ISSN: 0018-9219.
"Nonintrusive load monitoring" Retrieved from the Internet: URL:http://en.wikipedia.org/wiki/Noninstrusive_load_monitoring; Page last modified Apr. 29, 2010.
Hart, G.W., "Nonintrusive Appliance Load Monitoring" Retrieved from the Internet: URL:http://www.georgehart.com/research/nalm.html.
European Search Report for EP Appln. No. 09 30 5779 dated Mar. 26, 2010.

* cited by examiner

*Primary Examiner* — Bryan Bui
(74) *Attorney, Agent, or Firm* — Nathan O. Greene; Brinks Hofer Gilson & Lione

(57) ABSTRACT

A system and method for analyzing a customer load and/or generation profile in order to disaggregate the customer load and/or generation profile is provided. The analysis of the customer load and/or customer generation profile may thereby determine the one or more devices that are operating and that contribute to the customer load and/or generation profile. In this way, the system and method may automatically analyze the customer load and/or generation profile in order to determine the one or more devices that contribute to the load and/or generation profile.

22 Claims, 11 Drawing Sheets

SYSTEM AND METHOD FOR ELECTRIC PATTERNS DISCOVERY

REFERENCE TO RELATED APPLICATION

This application claims priority under 35 U.S.C. §119 to European patent application 09305779.2, filed Aug. 24, 2009, the disclosure of which is incorporated herein by reference in its entirety.

BACKGROUND

1. Field of the Invention

The present invention relates generally to a system and method for analyzing a customer load and/or generation profile (such as electrical, gas or water load profiles), and more particularly to a system and method for disaggregating the customer load and/or generation profile, thereby determining the one or more devices that contribute to the customer load and/or generation profile.

2. Related Art

Customers may have one or more appliances that draw energy (such as electricity or gas) or water from a central utility. The draw on the energy or water is sensed by a meter or other type of sensor that indicates the customer load profile (such as the electricity, natural gas, or water loads that the customer draws).

One type of meter is called a Smart Meter, which generally refers to a type of advanced meter (such as an electrical meter) that identifies consumption in more detail than a conventional meter. Specifically, the Smart Meter may sense the customer load profile in real-time or near real-time, and record the customer load profile. The customer load profile is an aggregation of the load drawn for the various appliances at the customer premises. The Smart Meter may communicate this customer load profile via a network back to the local utility for monitoring and billing purposes (telemetering).

Though devices such as the Smart Meter provide real-time load information, customers may still wish to learn the breakdown (or disaggregation) of the amount of load drawn for the various devices or appliances at the customer premises. In order to obtain this information, the customer typically configures additional sensors to sense the load drawn. For example, if a customer wishes to identify the electrical load drawn by a specific appliance (such as a heater), the customer may install a sensor dedicated to sensing the current drawn by the specific appliance. However, generating this break-down of the amount of load drawn can be inconvenient for the customer. Thus, there is a need to more easily determine the amount of load drawn by the various appliances at the customer premises.

BRIEF SUMMARY

The invention provides a system and method for analyzing a customer load and/or generation profile in order to disaggregate the customer load and/or generation profile. The analysis of the customer load and/or customer generation may thereby determine the one or more devices that are operating (such as activation and/or deactivation of the one or more devices) and thereby contribute to the customer load and/or generation profile. Load, such as electricity, natural gas, or water loads, may be sensed by a meter. One example of a meter may include a Smart Meter, which may measure in real-time or near real-time the load profile at a customer premises. The load profile is a measure of all of the devices that draw load in real-time. For example, an electricity load profile includes the aggregation of the loads for all of the devices that are drawing power in real-time. Moreover, the customer premises may generate energy, such as electrical energy. One example of a device to generate energy is solar panels. One or more sensors may generate a generation profile indicative of electricity generated at the customer premises. The generation profile is a measure of all of the devices that generate load in real-time. In particular, an electricity generation profile includes the aggregation of all of the devices that are generating energy in real-time (such as one or more solar panels) or over a predetermined time period.

The customer premises may communicate the data generated by the one or more sensors (including the customer load profile and/or the generation profile) to a central utility. The central utility may automatically analyze the customer load and/or generation profile in order to determine the one or more devices that contribute to the load and/or generation profile. And, because the analysis is based on the customer load and/or generation profile which is already used by the central utility, the customer premises does not need any additional software or processing in order to determine the one or more devices that contribute to the load and/or generation profile. In particular, the sensor used to generate the customer load profile may comprise a Smart Meter. The central utility may use the data sent from the Smart Meter (and already used by the central utility for other purposes, such as billing) in order to disaggregate the customer load profile without the need for additional processing at the customer premises. For example, the central utility may use the data sent from the Smart Meter, which may include the detailed consumption data from the real-time or near real-time sensors. This data from the Smart Meter may be used for billing, power outage notification, and power quality monitoring, and may also be used for disaggregating the customer load profile. In this way, the data from existing sensors (such as existing Smart Meters) may be transmitted to the central utility without the need for any special tailoring to the disaggregation at the central utility, such as without the need for reducing the size of the data (in order to transmit to the central utility), without the need for special logging requirements at the Smart Meters, and without the need for collaboration between the central utility and the Smart Meter manufacturers.

For example, the system and method may recognize predetermined electrical patterns in the electricity load profile (such as by using feature extraction) in order to identify the one or more devices that contribute to the electricity load profile (such as by using pattern recognition). As another example, the system and method may recognize predetermined electrical patterns in the electricity generation profile (such as by using feature extraction) in order to identify the one or more devices that contribute to the electricity generation profile (such as by using pattern recognition). In particular, the system and method may determine whether there are any generation devices resident at the customer premises that are operating (such as activation and/or deactivation of the generation devices). And, the system and method may determine the types of generation devices that are resident at the customer premises. Moreover, since the profile may include both load and generation, the system and method may recognize predetermined electrical patterns in order to which appliances are operating to identify both devices that contribute to the load profile and devices that contribute to the generation profile. Thus, the disaggregation analysis may analyze both load drawn and load generated at the customer site (i.e. 2-way energy analysis).

A database of reference or known load patterns may be used to recognize the electrical patterns. The database may comprise one or more predetermined characteristics or features of a particular known appliance (such as "on"/"off" steps for a known heater, etc.) or may comprise a predetermined waveform for the particular appliance. For example, the one or more characteristics of the known load and/or generation patterns may be used to disaggregate the customer load and/or generation profile. The "on"/"off" steps, events time-pattern, and steady state variations of the reference or known load pattern may be compared against the extracted features of the customer load profile in order to determine whether these characteristic(s) match the customer profile. Or, the database may comprise reference or known predetermined analog or digital waveforms. The predetermined waveform for the particular known appliance may then be compared against the extracted waveform. As another example, the characteristic(s) of the known generation pattern may be compared against the customer generation profile in order to determine whether these characteristic(s) match the customer generation profile. In this way, a pattern recognition engine may determine whether one or more appliances are on (or operating) and, in turn, whether the one or more appliances are resident at the customer premises.

The disaggregation of the customer load and/or generation profile may have several applications, including applications on the customer side and applications on the utility side. On the customer side, the analysis of the customer load profile may be used to determine what appliances are resident at the customer premises. For example, the customer load profile may be used to determine the appliances at the customer premises (such as number of heaters) or may be used to determine the type of appliances at the customer premises (such as the make and/or model of the heaters).

The analysis may further be used to determine the actual load profiles for the appliances at the customer premises. For example, an appliance at the customer premises may be similar to a known profile stored in the database (such have similar characteristics to the known profile). However, the load profile of appliance may deviate from the known profile for a variety of reasons, such as age or maintenance of the appliance. The disaggregation may identify the actual load profiles for the one or more appliances at the customer premises. The actual load profiles, which may more accurately reflect the load profile for the appliance than the known profile, may then be stored in the database for future reference or for comparison with other profiles.

The analysis may also be used to determine the energy or water usage of a particular appliance for a predetermined period (such as for a time period of one day). The information may then be used to educate the customer, such as informing the customer about how much energy is used daily for the particular appliance. Or, the energy usage information may be compared with a comparable appliance to determine if the appliance is operating efficiently. This efficiency information may be provided to the user. Or, the information may be used to determine if the operation of one or more appliances is faulty. For example, the load profiles for appliances which are characterized with regular and distinctive time patterns (such as refrigeration appliances) may be analyzed and compared with known load patterns in order to determine whether the appliances are operating properly (such as if the refrigeration appliance is broken). This information may then be provided to the user.

The customer energy profile may also be analyzed to determine whether the customer premises has any generation sources. In the event that a utility worker needs to service the customer premises, information on whether the customer premises has any generation sources (such as a solar panel) that contributes to the line power may be relevant. In particular, even if the power to the customer premises is removed, if the customer premises has a generation source, the utility worker may still be in danger. The disaggregation analysis may thus determine whether the customer premises has any power generation devices to alert the utility worker. Moreover, the customer generation profile may be analyzed to: (1) determine what power generation devices (and/or specific models of devices) that are resident at the customer premises; (2) determine an amount of power generated at the customer site in order for the central utility to predict how much power may be generated at one or more customer sites; (3) determine the potential power generation for the specific products (such as if the same solar panel is in two customer premises, the power generation profile may be determined); (4) determine if the power generating device is faulty (such as by comparing the amount of power generated at the customer premises for a specific power generating model/device with a predetermined or known amount of power from the specific model); and (5) determine if the power generating device may be corrupting the power supplied to the customer premises (or to other customers premises).

On the utility side, the analysis of the customer load profile may be used to determine a load pattern for a particular appliance. For example, if two customers have the same appliance, the load profiles for each of the customers may be analyzed to determine a commonly shared load pattern. In this way, rather than having to separately sense the load pattern for the particular appliance, the load pattern may be determined by comparing the load profile for two different customers. The database of known profiles may thus be populated more efficiently by analyzing the customer load profiles from two or more customer premises.

The analysis of the customer load profile may also be used to determine which appliances are operating for purposes of demand response. The analysis may be performed in real-time (or near real-time) whereby the real-time customer load profile may be analyzed to determine which appliances are currently operating. Based on the devices that are determined to be operating, demand response may select the appliance to be turned off. For example, the analysis may determine that the heater and the dishwasher are currently operating. Demand response may determine that the dishwasher (rather than the heater) may be turned off to reduce power consumption. Alternatively, the analysis may be used to develop an operating appliance model, which is a model indicative of the appliances that are operating for the particular customer. For example, the analysis may determine which appliances are operated at various times in a predetermined period (such as 24 hours) and populate the model with this information. When demand response seeks to determine which of the particular customer's appliances are operating, demand response may input to the model the particular time (such as 2 PM) and may receive from the model the appliances that are operating for the particular time.

The analysis of the customer load profile may further be used to determine the consumption for a particular customer in order to predict future consumption. Utilities typically seek to estimate consumption in order to provide sufficient energy to the power grid and to ensure stability of the power grid. The analysis of the customer load profile may be used to generate a consumption model for the particular customer, thereby allowing for better prediction of consumption for a section of the power grid or the power grid as a whole.

The analysis of the customer load and/or generation profile may be used by the central utility to determine if there is a device at the customer's site that is corrupting the power line (such as making the frequency of the power line deviate outside of specifications).

In addition, the analysis of the customer load and/or generation profile may be used by the central utility for billing purposes. One example may be for usage-based billing schemes. The central utility may charge electricity differently depending on the end-use. For instance, a central utility may charge base-load appliances (i.e. devices which are on all the time) at a lower rate than devices generating bursty load. The reasoning is that baseload-related power usage can be more accurately predicted by the central utility and as such it may correspond to a lower cost-to-serve. Another example may be for energy service-level agreements. The central utility may sell a service for maintaining a pre-agreed level of service (such as maintaining a predetermined temperature at the client premises as opposed to selling a heating/cooling service). As still another example, the central utility may offer a service for replacing appliances based on the disaggregation analysis. In particular, an appliance upgrade may be paid for by the generated energy savings. Based on the demand monitoring data, a central utility may identify customers owning low efficiency refrigerators and offer them the service of replacing one or more devices (such as a refrigerator, heater, lighting, etc.) with a more efficient one against a fixed monthly fee, which is lower than what their old device used to cost them.

Other systems, methods, features and advantages will be, or will become, apparent to one with skill in the art upon examination of the following figures and detailed description. It is intended that all such additional systems, methods, features and advantages be included within this description, be within the scope of the invention, and be protected by the following claims.

DETAILED DESCRIPTION

Figure 1:
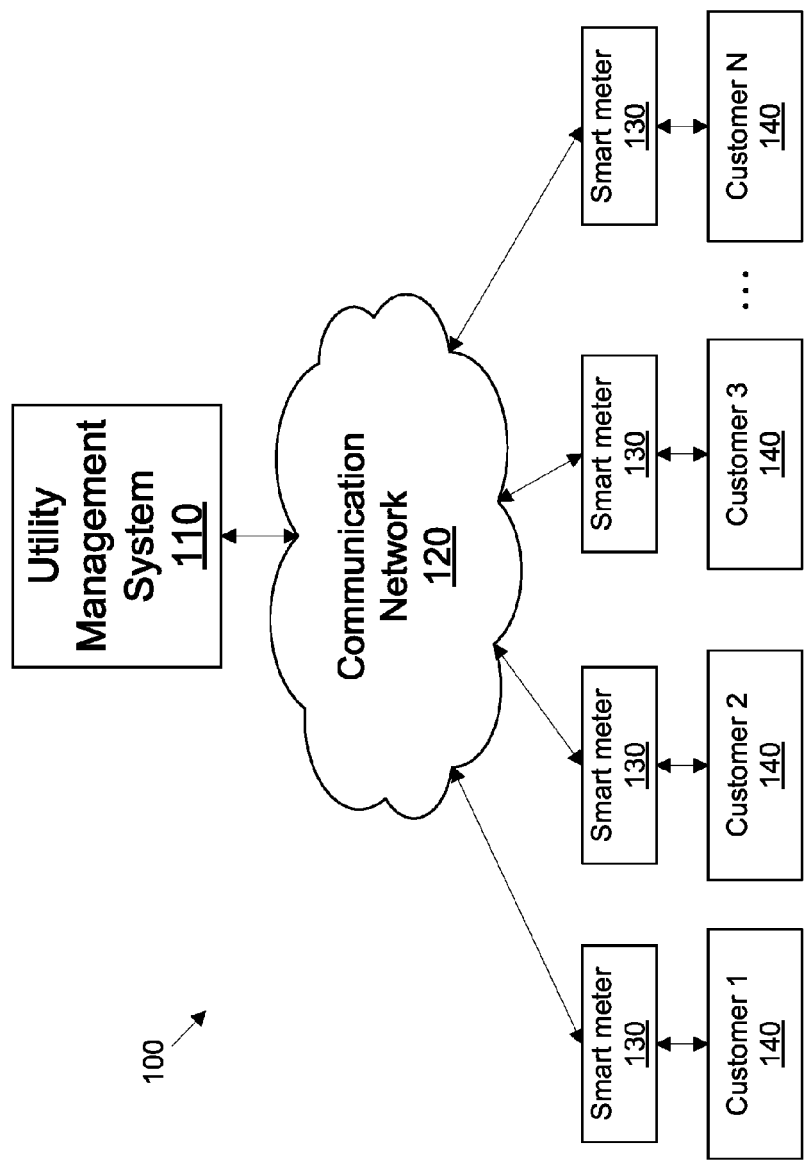
FIG. 1 is a block diagram of one configuration of the utility management system, communication network, and customer premises.

By way of overview, the preferred embodiments described below relate to a method and system for analyzing a customer load and/or generation profile. Specifically, a central computer (or set of computers) may analyze the customer load and/or generation profile in order to disaggregate the customer load and/or generation profile. As discussed in more detail below, one or more devices contribute to the customer load and/or generation profile. The central computer may determine one, some, or all of the devices that are operating and that contribute to the customer load and/or generation profile.

The customer load profile may be, for example, an electrical load profile, a gas load profile, or a water load profile. In the example of an electrical load profile, the central computer may disaggregate the electrical load profile in order to determine the one or more devices that draw power and contribute the electrical load profile. Moreover, the customer premises may generate energy, such as electrical energy. One example of a device to generate energy is solar panels. The customer generation profile is a measure of all of the devices that generate load in real-time. In particular, an electricity generation profile includes the aggregation of all of the devices that are generating energy in real-time (such as one or more solar panels).

The central computer may be part of, or used in combination with, existing hardware of a utility system (such as a power utility system, a natural gas system, or a water authority system). For example, the central computer may work in combination with meters resident at the customer's premises (such as Smart Meters) and utility communication networks in order to obtain the customer load profile for analysis.

Specifically, Smart Meters or sensors (resident at the customer's premises) may generate data regarding the customer load profile. For example, the Smart Meter may generate data regarding one or more aspects of the customer load profile, such as active power, reactive power, phase angle, frequency, and/or power factor. The customer load profile, including the one or more aspects of the customer load profile, may thereafter be sent to the central computer for analysis. One example of the network to communicate the data from the Smart Meters to the central computer is disclosed in U.S. Provisional Application No. 61/127,294, filed May 9, 2008, U.S. Provisional Application No. 61/201,856, filed Dec. 15, 2008, and U.S. application Ser. No. 12/378,102, filed on Feb. 11, 2009, each of which is hereby incorporated by reference in their entirety. As discussed in more detail below, the central computer may be a part of (or work in combination with) a local utility, and may automatically analyze the customer load profile in order to determine the one or more devices that contribute to the load profile.

Further, the central utility may use the data sent from the Smart Meter (such as active power, reactive power, phase angle, frequency, and/or power factor) in the disaggregation analysis. This data is already used by the central utility for other purposes, such as billing, power outage notification, and power quality monitoring. In this way, the customer premises need not transmit a special form of the data to the central utility in order for the central utility to perform the disaggregation analysis. So that, existing Smart Meters may be used to generate the data used by the central utility without the need for upgrading existing Smart Meters. The disaggregation of the customer load and/or generation profile may have several applications, including applications on the customer side and applications on the utility side. On the customer side, the analysis of the customer load and/or generation profile may be used to determine what appliances are resident at the customer premises (including the one or more devices that draw load at the customer premises and the one or more devices that generate energy at the customer premises). The analysis may further be used to determine the actual load profiles for the appliances at the customer premises. The analysis may also be used to determine the energy or water usage or energy generation of a particular appliance for a predetermined period (such as one day). The information may then be used to educate the customer, such as informing the customer about how much energy is used daily or generated daily for the particular appliance.

On the utility side, the analysis of the customer load profile may be used to determine a load pattern or a generation pattern for a particular appliance. The analysis of the customer load profile may also be used to determine which appliances are operating for purposes of demand response. The analysis of the customer load profile may further be used to determine the consumption and/or generation for a particular customer in order to predict future consumption and/or generation.

Turning to the drawings, wherein like reference numerals refer to like elements, FIG. 1 illustrates is a block diagram of one configuration 100 of the utility management system 110, communication network 120, and customers 140. The customers 140 may comprise one or more customers, such as the 1 to N customers depicted in FIG. 1, with N being any number of customers. The customers 140 may have associated with then one or more meters, such as Smart Meters 130.

Smart Meters 130 may generate data as real-time or near real-time reads, power outage notification, and power quality monitoring. The real-time or near real-time reads may be stored at the Smart Meters 130, and transmitted periodically to the utility management system 110 via the communication network 120. Or, the real-time or near real-time reads may be transmitted in real-time to the utility management system 110. For example, the Smart Meter may provide one sample of the customer load and/or generation profile every minute (or every 5 minutes). The ratio between the frequency of events (for example, an appliance turning on or off or changing status) and the Smart Meter sampling rate is a decisive performance factor. Better results may be obtained when, statistically speaking, in most cases at most one event is recorded during each sampling period.

Figure 6:
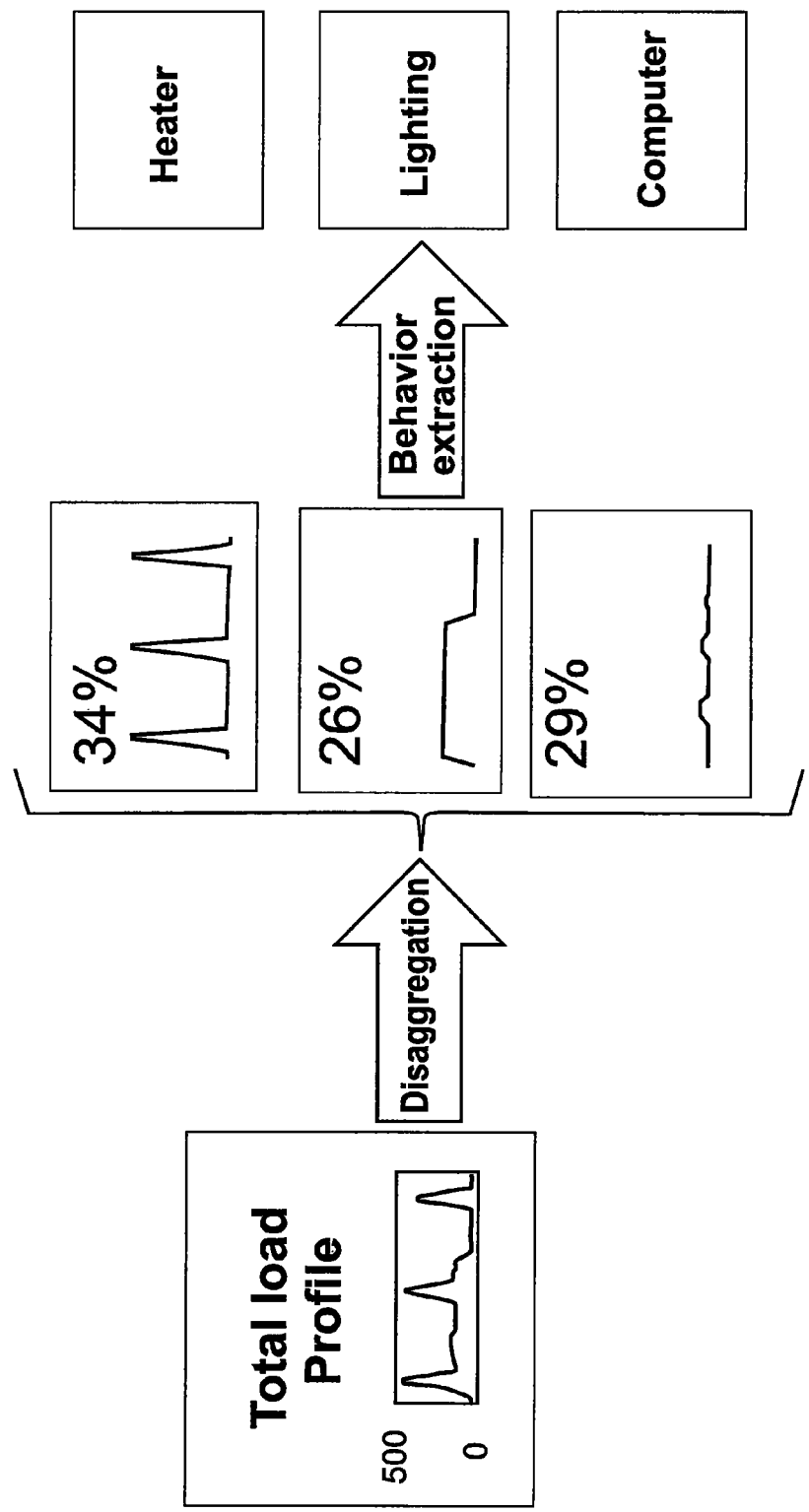
FIG. 6 illustrates an example of the disaggregating the customer load profile.
Figure 8:
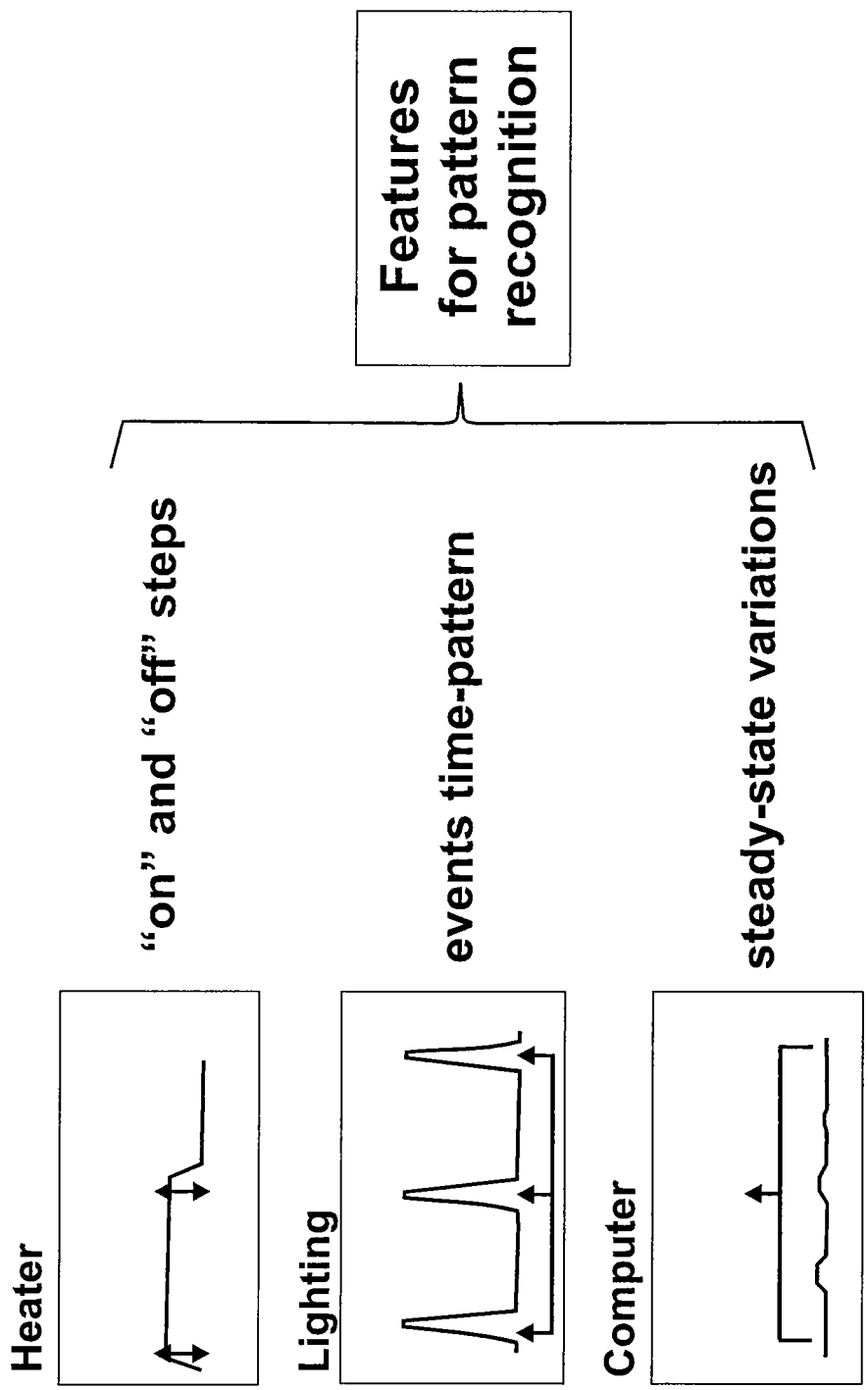
FIG. 8 illustrates examples of the features for pattern recognition.

The Smart Meter 130 may provide more information than traditional electrical meters, which only measure total consumption and as such provide no information of when the energy was consumed. For example, the Smart Meter 130 may provide a customer load and/or generation profile for the energy usage (such as electrical or gas energy) or water usage for the customer's premises, and for the energy generation. The customer load and/or generation profile may be represented as a graph of the variation in the electrical load versus time, such as illustrated in FIGS. 6 and 8.

FIG. 1 further illustrates utility management system 110. The utility management system 110 may be part of a central utility management system, such as an operations control center as disclosed in U.S. Provisional Application No. 61/127,294, filed May 9, 2008, U.S. Provisional Application No. 61/201,856, filed Dec. 15, 2008, and U.S. Utility application Ser. No. 12/378,102, filed on Feb. 11, 2009, the entirety of each of the applications are hereby incorporated by reference. As discussed in more detail below, the centrality of the utility management system 110 aids in the disaggregation of the customer load and/or generation profile in several ways, including the ability to access a central database that stores known load and/or generation patterns, the ability to compare the customer load and/or generation profile with the stored known load and/or generation patterns and the ability to compare a customer profile from a first customer with a customer profile from a second customer. Alternatively, the computer that analyzes and disaggregates the customer load and/or generation profile may be resident at the customer premises (such as a personal computer in communication with the Smart Meter and resident at the customer premises).

Figure 2:
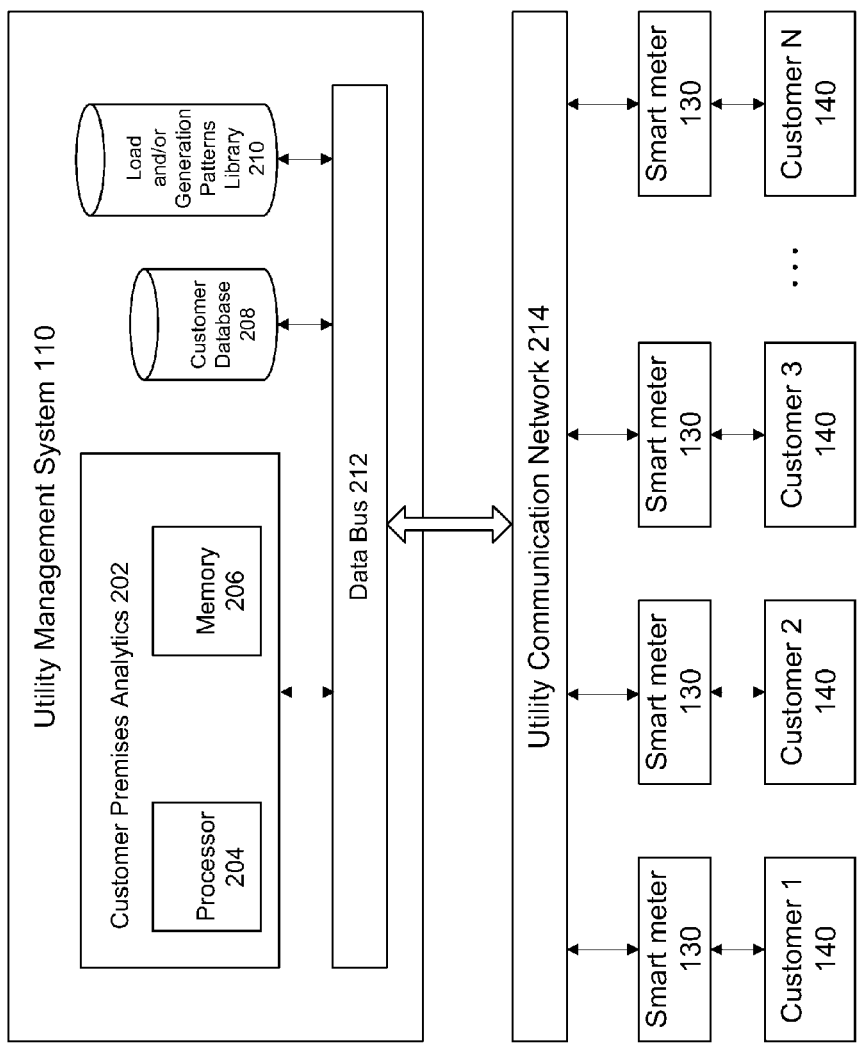
FIG. 2 is a more detailed block diagram of the utility management system of FIG. 1.

FIG. 2 illustrates an expanded block diagram of the utility management system 110. The utility management system 110 may receive data (such as customer load and/or generation profiles) from the Smart Meters 130 of customers 140 via utility communication network 214. The utility communication network 214 may comprise one or more networks, including public and private wireless and/or wired networks.

Figure 5:
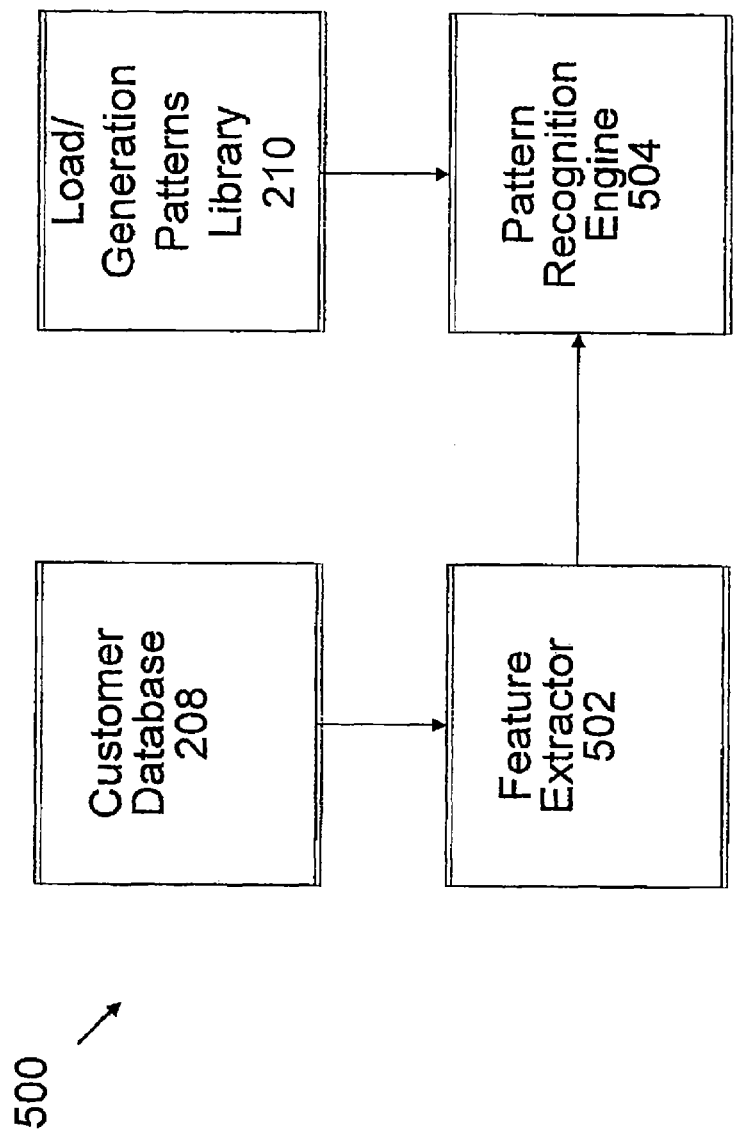
FIG. 5 is a block diagram of the feature extractor, pattern recognition engine and the one or more databases.

The utility management system 110 may receive the data from the Smart Meters 130 via data bus 212. The utility management system 110 may comprise one or more computer systems, such as represented by customer premises analytics 202, and one or more databases, such as represented by customer database 208 and load and/or generation patterns library 210. The customer database 208 may include the customer load and/or generation profiles as generated by the Smart Meter 130 for one, some or all of the customers that are managed by the utility management system 110. The customer load and/or generation profiles stored in the customer database 208 may be accessed by the customer premises analytics 202 for analysis. For example, the customer premises analytics 202 may include one or more meter-disaggregation algorithms. The processor may use the meter-disaggregation algorithm (which may comprise a system 500 that includes a feature extractor 502 and pattern recognition engine 504 as discussed in FIG. 5). The meter-disaggregation algorithm may use time patterns with latency equal to the search window for time patterns (such as 1 Smart Meter sampling per period or 10 Smart Meter samplings per period). The customer database 208 may further include the load patterns and/or generation patterns for one, some, or all of the appliances at a customer premises. As discussed below, the customer premises analytics 202 may analyze the customer load and/or generation profiles to determine a load pattern and/or generation pattern specific to an appliance resident at the customer premises. This load and/or generation pattern may be stored in the customer database for later use by the customer premises analytics 202.

Further, the load and/or generation patterns library 210 may include the load and/or generation patterns for one or more appliances. The load patterns in the load and/or generation patterns library 210 may be arranged in a variety of ways. For example, the load and/or generation patterns may be arranged by appliance (such as load patterns for a heater, incandescent lighting, fluorescent lighting, refrigeration, a computer, etc.), by type of appliance (such as load patterns for a laptop computer, a desktop computer, etc.), by make of appliance (such as load patterns for a Dell® laptop computer, Dell® desktop computer, etc.), and/or by make/model of appliance. Further, the load and/or generation patterns for one or more appliances may comprise different forms. One form stored in the database may comprise a waveform for the appliances, such as an analog or digital waveform for the appliance. Another form may comprise one or more features of the appliances, such as the "on"/"off" steps, events time-pattern, and steady state variations. As discussed below, the feature extractor 502 may extract one or more features from the customer load profile. The pattern recognition engine 504 may analyze the extracted features with the one or more features stored in the database.

The division of the databases and computer systems as shown in FIG. 2 are provided for illustration purposes only. For example, FIG. 2 illustrates a separate memory 206 and customer database 208 and load and/or generation patterns library 210. Alternatively, memory 206 may house one or both of customer database 208 and load and/or generation patterns library 210.

The customer premises analytics 202 includes a processor 206 and a memory 206 that can communicate via a bus (not shown). The memory 206 may include volatile and/or non-volatile memory, and may include one or more programs. The memory 206 may be a main memory, a static memory, or a dynamic memory. The memory 206 may include, but may not be limited to, computer-readable storage media such as various types of volatile and non-volatile storage media including, but not limited to, random access memory, read-only memory, programmable read-only memory, electrically programmable read-only memory, electrically erasable read-only memory, flash memory, magnetic tape or disk, optical media and the like. In one case, the memory 206 may include a cache or random access memory for the processor 204. Alternatively or in addition, the memory 206 may be separate from the processor 204, such as a cache memory of a processor, the system memory, or other memory. The memory 206 may be an external storage device or database for storing data. Examples may include a hard drive, compact disc ("CD"), digital video disc ("DVD"), memory card, memory stick, floppy disc, universal serial bus ("USB") memory device, or any other device operative to store data. The memory 206 may be operable to store instructions executable by the processor 204. The functions, acts or tasks illustrated in the figures (such as FIGS. 3 and 4) or described herein may be performed by the programmed processor 204 executing the instructions stored in the memory 206. The functions, acts or tasks may be independent of the particular type of instruction set, storage media, processor or processing strategy and may be performed by software, hardware, integrated circuits, firm-ware, micro-code and the like, operating alone or in combination. Likewise, processing strategies may include multiprocessing, multitasking, parallel processing and the like.

The computer system for the customer premises analytics 202 may further include a display, such as a liquid crystal display (LCD), an organic light emitting diode (OLED), a flat panel display, a solid state display, a cathode ray tube (CRT), a projector, a printer or other now known or later-developed display device for outputting determined information. The display may act as an interface for the user to see the functioning of the processor 204, or specifically as an interface with the software stored in the memory 206 or in the drive unit.

Additionally, the computer system for the customer premises analytics 202 may include an input device configured to allow a user to interact with any of the components of system. The input device may be a number pad, a keyboard, or a cursor control device, such as a mouse, or a joystick, touch screen display, remote control or any other device operative to interact with the system.

The computer system for the customer premises analytics 202 may also include a disk or optical drive unit. The disk drive unit may include a computer-readable medium in which one or more sets of instructions, e.g. software, can be embedded. Further, the instructions may perform one or more of the methods or logic as described herein. The instructions may reside completely, or at least partially, within the memory 206 and/or within the processor 204 during execution by the computer system. The memory 206 and the processor 204 also may include computer-readable media as discussed above. For example, the instructions to perform the actions illustrated in FIGS. 3 and 4 (described below) may be included in the memory 206.

The present disclosure contemplates a computer-readable medium that includes instructions or receives and executes instructions responsive to a propagated signal. The instructions may be implemented with hardware, software and/or firmware, or any combination thereof. Further, the instructions may be transmitted or received over the network via a communication interface. The communication interface may be a part of the processor 204 or may be a separate component. The communication interface may be created in software or may be a physical connection in hardware. The communication interface may be configured to connect with a network, external media, the display, or any other components in system, or combinations thereof. The connection with the network may be a physical connection, such as a wired Ethernet connection or may be established wirelessly as discussed below. Likewise, the additional connections with other components of the system may be physical connections or may be established wirelessly.

Figure 3:
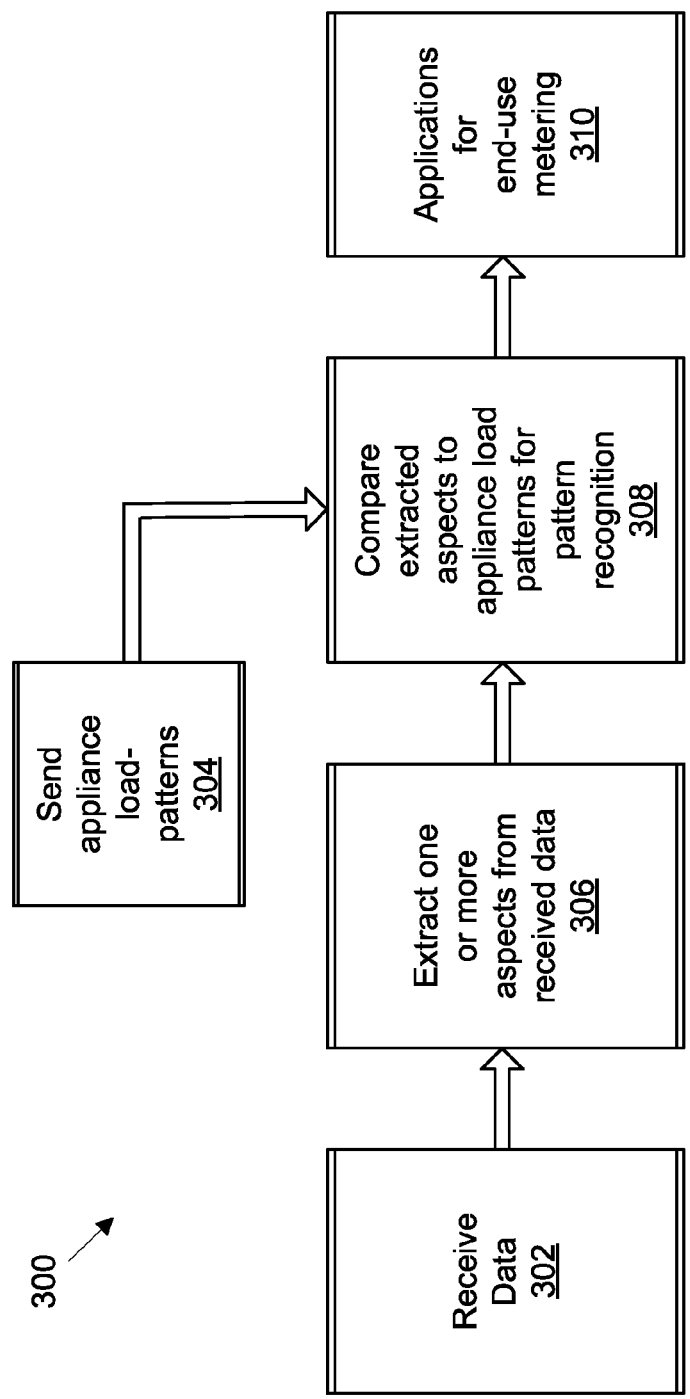
FIG. 3 is a flow diagram of disaggregating the customer load profile.

FIG. 3 is a flow diagram 300 of disaggregating the customer load profile. As shown at block 302, the data is received. The data may include the customer load profile, such as shown in FIGS. 6 and 8, and may be sent from Smart Meters 130. The data may be sent in real-time or near real-time to when the data was generated by the Smart Meters 130. Or, the data may be sent periodically or upon request by the utility management system 110.

At least one aspect, such as a feature and/or an event in the received data, may be extracted, as shown at block 306. Feature extraction may be used in combination with pattern recognition. In particular, feature extraction may be performed using feature extractor 502 (illustrated in FIG. 5) and comprise a special form of dimensionality reduction for use in pattern recognition. When the input data to an algorithm is too large to be processed and it is suspected to be notoriously redundant (much data, but not much information) then the input data may be transformed into a reduced representation set of features (also named features vector). Transforming the input data into the set of features may comprise features extraction. If the features extracted are carefully chosen, the features set will extract the relevant information from the input data in order to perform the desired task using this reduced representation instead of the full size input.

Feature extraction may involve simplifying the amount of resources required to describe a large set of data accurately. When performing analysis of complex data such as analyzing an overall load profile, there are a number of variables involved. Analysis with a large number of variables generally requires a large amount of memory and computation power or a classification algorithm which overfits the training sample and generalizes poorly to new samples. Feature extraction may include methods of constructing combinations of the variables to get around these problems while still describing the data with sufficient accuracy.

General dimensionality reduction techniques may assist in the feature extraction, including: principal components analysis; semidefinite embedding; multifactor dimensionality reduction; nonlinear dimensionality reduction; isomap; kernel PCA; latent semantic analysis; partial least squares; and independent component analysis.

For example, the customer premises analytics 202 may analyze the received customer load profiles for one or more aspects. Examples of the aspects or features that may be extracted include, but are not limited to, "on"/"off" steps, events time-pattern, and steady state variations, as illustrated in FIG. 8. Other aspects may be extracted as well. The extracted aspects may be forwarded to pattern recognition engine 504 (illustrated in FIG. 5) in the customer premises analytics 202 for comparison with appliance load patterns. Further, some or all of the appliance load patterns may be sent to the pattern recognition engine 504 as well, as shown at block 304. For example, the load and/or generation patterns library 210 may be sent to the pattern recognition engine 504. Or, aspects of the appliance load patterns from the load and/or generation patterns library 210 may be sent to the pattern recognition engine 504. The aspects of the appliance load patterns may be similar to those aspects that were extracted from the received data in block 306.

The pattern recognition engine 504 may then compare the extracted aspects with the appliance load patterns (or the aspects of the appliance load patterns), as shown at block 308. Pattern recognition may focus on classifying data (patterns) based either on a priori knowledge or on statistical information extracted from the patterns. The patterns to be classified may include groups of measurements or observations, defining points in an appropriate multidimensional space.

The pattern recognition engine 504 may use data from a sensor (such as a Smart Meter) that gathers the observations to be classified or described (such as an overall load profile), a feature extraction mechanism (discussed above) that computes numeric or symbolic information from the observations, and a classification or description scheme that does the actual job of classifying or describing observations, relying on the extracted features.

The classification or description scheme may be based on the availability of a set of patterns that have already been classified or described (such as a database of known load patterns in library 210). The classification or description scheme may use one or more of the following approaches: statistical (or decision theoretic) or syntactic (or structural). Statistical pattern recognition is based on statistical characterizations of patterns, assuming that the patterns are generated by a probabilistic system. Syntactical (or structural) pattern recognition is based on the structural interrelationships of features. A wide range of algorithms may be applied for pattern recognition, from simple Bayes classifiers to powerful neural networks.

Based on the comparison, the customer load profile may be disaggregated, with the disaggregated customer load profile being applied to end-use metering, as shown at block 310. In particular, the disaggregation of the customer load profile may have several applications, including applications on the customer side and applications on the utility side.

Similar to FIG. 3, disaggregating of the customer generation profile may be performed. For example, the data indicative of power generation may be received, with one or more aspects extracted from the received data. The extracted aspects may then be compared with appliance generation patterns for pattern recognition. Moreover, disaggregating of the customer generation and load profile may be performed. This may involve analysis of both the power drawn and power generated. For example, the customer generation and load profile may be disaggregated into a first subset of loads (that is a first profile that includes the load drawn) and a second subset of power generation (that is a second profile that includes the power generated). Using disaggregation, the first subset of loads may be ascribed to one or more load-drawing appliances resident at the customer premises. And, using disaggregation, the second subset of power generation may be ascribed to one or more power-generating appliances. In this way, one overall customer profile, that includes both power load drawn from and power generation supplied by the customer premises, may be disaggregated into the a first profile that includes the load drawn and a second profile that includes the power generated. The first profile may then be used to determine the one or more devices that draw power. And, the second profile may then be used to determine the one or more devices that generate power.

On the customer side, the analysis of the customer load and/or generation profile may be used to determine what appliances are resident at the customer premises and/or what percentage of load is drawn or power is generated by the appliances. Specifically, since the load draw for the appliances is additive, analysis of the customer load profile may be used to determine one, some, or all of the appliances at the customer premises. For example, if the customer load profile matches or is similar to one or more aspects of a known pattern for a particular appliance (e.g., Appliance A stored in load and/or generation patterns library 210), it may be determined that one of the appliances that contributes to the customer load profile is Appliance A. Similarly, if the customer generation profile matches or is similar to one or more aspects of a known pattern for a particular appliance (e.g., Appliance B stored in load and/or generation patterns library 210), it may be determined that one of the appliances that contributes to the customer generation profile is Appliance B. Alternatively, the comparison of the customer load profile with a known pattern may be used to determine the type of appliances at the customer premises (such as the make and/or model of the heaters). An example of this is illustrated in FIG. 6. A total customer load profile is depicted in the left-hand portion of FIG. 6. This total customer load profile is analyzed and disaggregated using behavior extraction into three subparts of load drawn by three separate appliances (a heater, lighting, and a computer). The disaggregation may further determine a percentage of load drawn by each of the appliances. As shown in FIG. 6, the heater draws 34% of the total customer load, the lighting draws 26% of the total customer load, and the computer draws 29% of the total customer load. Similarly, the comparison of the customer generation profile with a known pattern may be used to determine the type of appliances at the customer premises (such as the make and/or model of the solar panels).

Figure 7B:
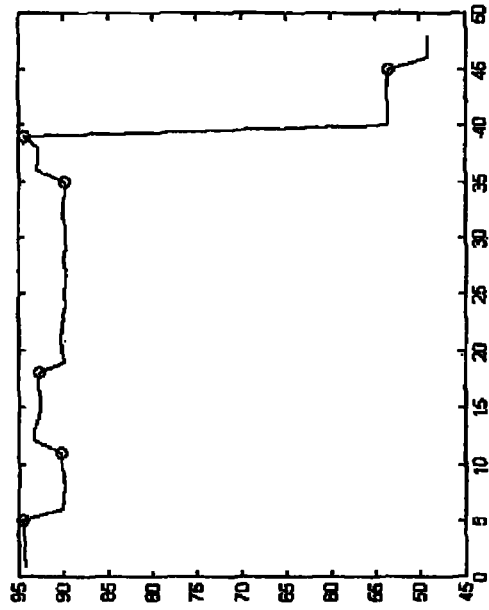
FIGS. 7a-f are a series of graphs that illustrate the feature extraction and pattern recognition.
Figure 7A:
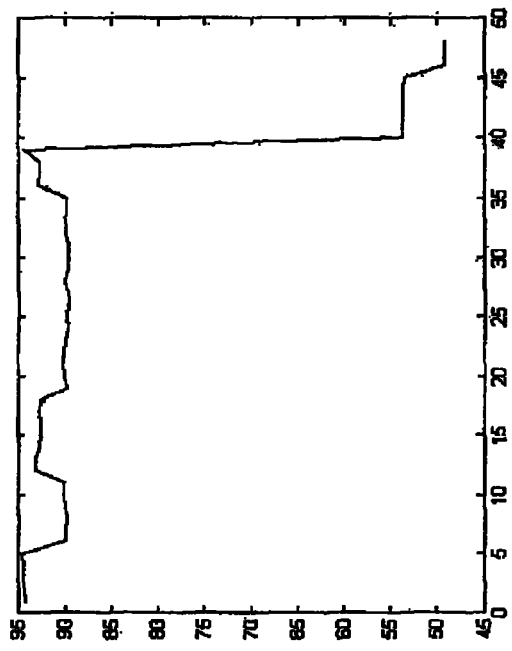

FIGS. 7*a-f* are a series of graphs that illustrate the feature extraction and pattern recognition. FIG. 7*a* is an example of the output from a Smart Meter (or a Smart Meter record). The feature extractor 502 may take as an input the measurement data from the Smart Meter (or any equivalent device). The measurement data from the Smart Meter may include a time tag as well as a series of electrical parameters such as power, reactive power etc. The feature extractor 502 may select a subset of the measurement data, and tag or flag the subset of the measurement data as corresponding to one or more events. An event may comprise a significant enough variation, between two consecutive meter sampling points, of one of the measured electrical parameters. FIG. 7*b* illustrates the detection of events, as shown in the circles present in the figure.

The pattern recognition engine 504 may use one or more different aspects of the detected events in order to classify them into one of the predefined electricity end-use categories. For example, the pattern recognition engine 504 may use three different aspects including: (1) the electrical parameters associated with each event (at this stage, the pattern recognition engine may classify each event independently of what happened before or after it; a likelihood value may be computed for its pair of event and end-use category); (2) events time pattern (the pattern recognition engine may use the time series characteristics of the event in order to refine the likelihoods computed at the previous stage); and (3) grammar rules (the last stage of pattern recognition engine may act as a kind of "sanity check"; for example, one rule may be that no off-event (i.e. an event corresponding to a certain appliance turning off) can be classified into a certain end-use category if no anterior matching on-event was classified into the same considered category—an appliance can not be turned off if it was not turned on in the first place).

Figures 7C, 7D:
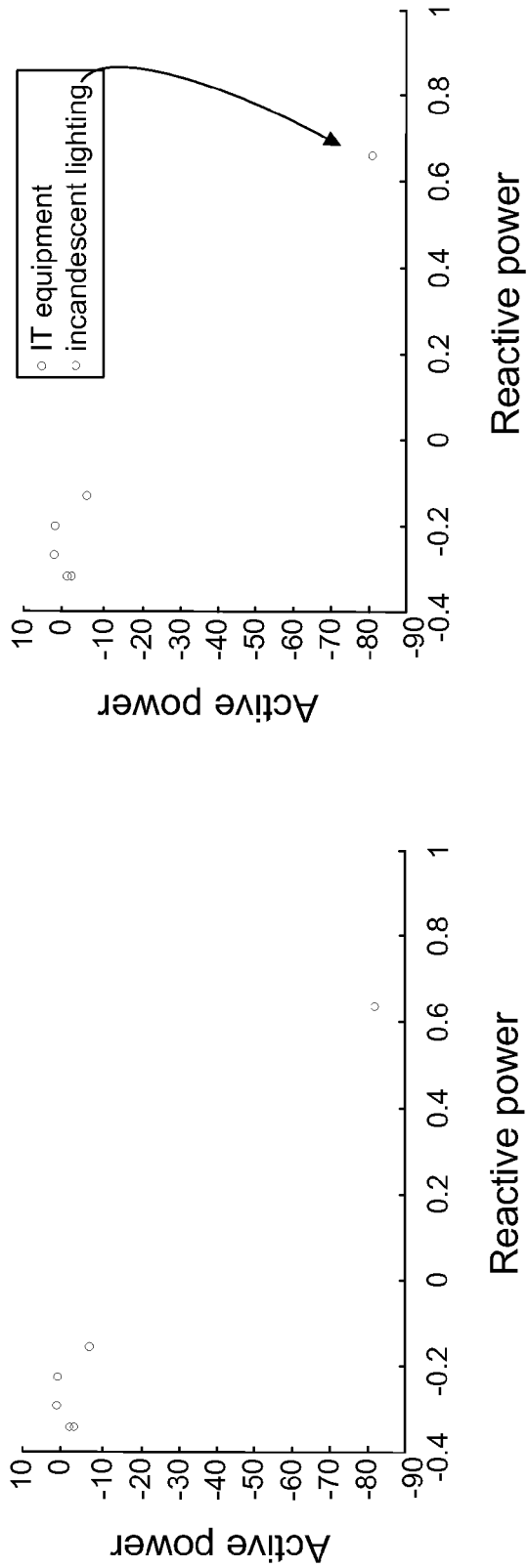
Figures 7E, 7F:
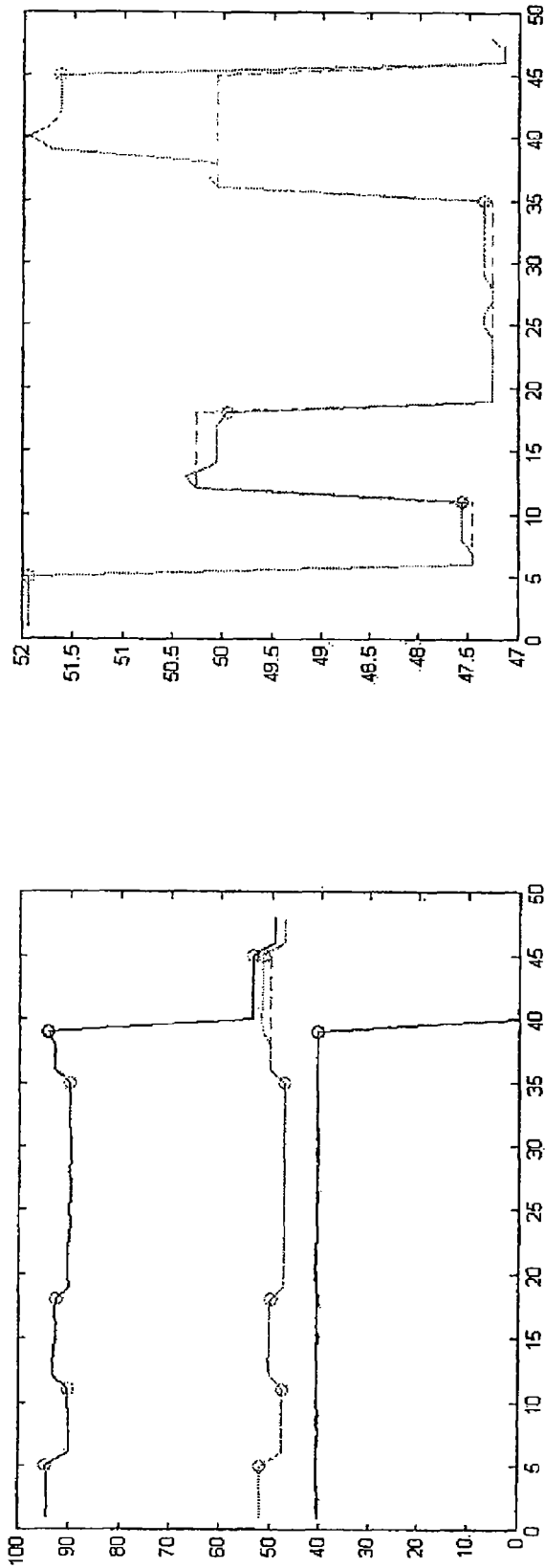

FIG. 7*c* illustrates the projection of the events (as illustrated in FIG. 7*b*) in the multidimensional feature space. And, FIG. 7*d* illustrates the classification of the events into the most likely end use categories. For example, using the pattern recognition engine 504, the events as illustrated in FIG. 7c may be categorized into IT equipment and incandescent lighting, as illustrated in FIG. 7d. FIGS. 7e and 7f show the breakdown of the actual versus estimated energy use breakdown.

The analysis may further be used to determine the actual load profiles or actual generation profiles for one or more appliances at the customer premises. For example, an appliance at the customer premises may be similar to a known profile stored in the database (such have similar aspects to the known profile). However, the load profile of appliance may deviate from the known profile for a variety of reasons, such as age or maintenance of the appliance. Comparing one or more aspects of the customer load profile with the one or more aspects of known load patterns may identify, within the customer load profile, the portion of subset of the customer load profile that is drawn by an appliance. For example, a known load pattern for a heater may include certain "on"/"off" steps. These certain "on"/"off" steps may be found in the customer load profile so that the heater may be identified as operating and the portion of the customer load profile drawn by the heater at the customer premises may be found. The actual load profiles, which may more accurately reflect the load profile for the appliance than the known profile, may then be stored in the database for future reference or for comparison with other profiles. An example of this is shown in FIG. 6, which illustrates the disaggregation of the total customer load profile into three load profiles. The heater profile (which draws 34% of the total customer load profile as shown in FIG. 6) may be stored in the database. Similarly, comparing one or more aspects of the customer generation profile with the one or more aspects of known generation patterns may identify, within the customer generation profile, the portion of subset of the customer generation profile that is generated by an appliance.

The analysis may also be used to determine the energy or water usage of a particular appliance for a predetermined period (such as one day). The information may then be used to educate the customer, such as informing the customer about how much energy is used daily for the particular appliance. Similarly, the analysis may be used to determine the energy generated for a particular appliance for a predetermined period (such as one day).

In the case of a heater, the amount of energy required to heat a household for a predetermined period (such as a day, week, or month) and the associated cost may be calculated for a current temperature of operation (such as 70° F.). An example of the heater load profile is illustrated in FIG. 6 and may be used to determine the cost per day. This associated cost may be presented to the customer for review. In addition, the associated cost for the amount of energy of operating the appliance at a second temperature (such as 67° F.) may be presented to the customer for comparison. In this way, the differing costs for heating the household may be presented to the user in order to educate the user as to the effects of adjusting the operation of one or more appliances in the household.

Alternatively, the energy usage information may be compared with a comparable appliance to determine if the appliance is operating efficiently (or is faulty). For example, the customer database 208 may include information regarding appliances at different customers (such as Customer A and Customer B). The customer premises analysis 202 may determine the one or more appliances resident at Customer A and search the customer database 208 for similar appliances at another customer (such as Customer B). One such appliance may be a particular make/model of heater. The customer premises analysis 202 may determine the cost of operating the particular make/model of heater for both Customer A and Customer B, and compare the costs. This comparison may be presented to the customer in order to educate the customer as to the efficiency of the particular appliance in comparison to similar appliances. In the heater example, if the operation of the heater at Customer A costs more than at Customer B, the customer premises analysis 202 may present to the customer different possibilities for the difference in cost (such as maintenance of the heater, additional insulation at Customer B, etc.). Similarly, the energy generation information may be compared with a comparable appliance to determine if the appliance is operating efficiently (or is faulty). For example, if it is determined that the solar panel is not generating an amount of power comparable to what is predicted for that region or location, it may be determined that the solar panel is faulty or the solar panel is installed improperly.

Figure 9:
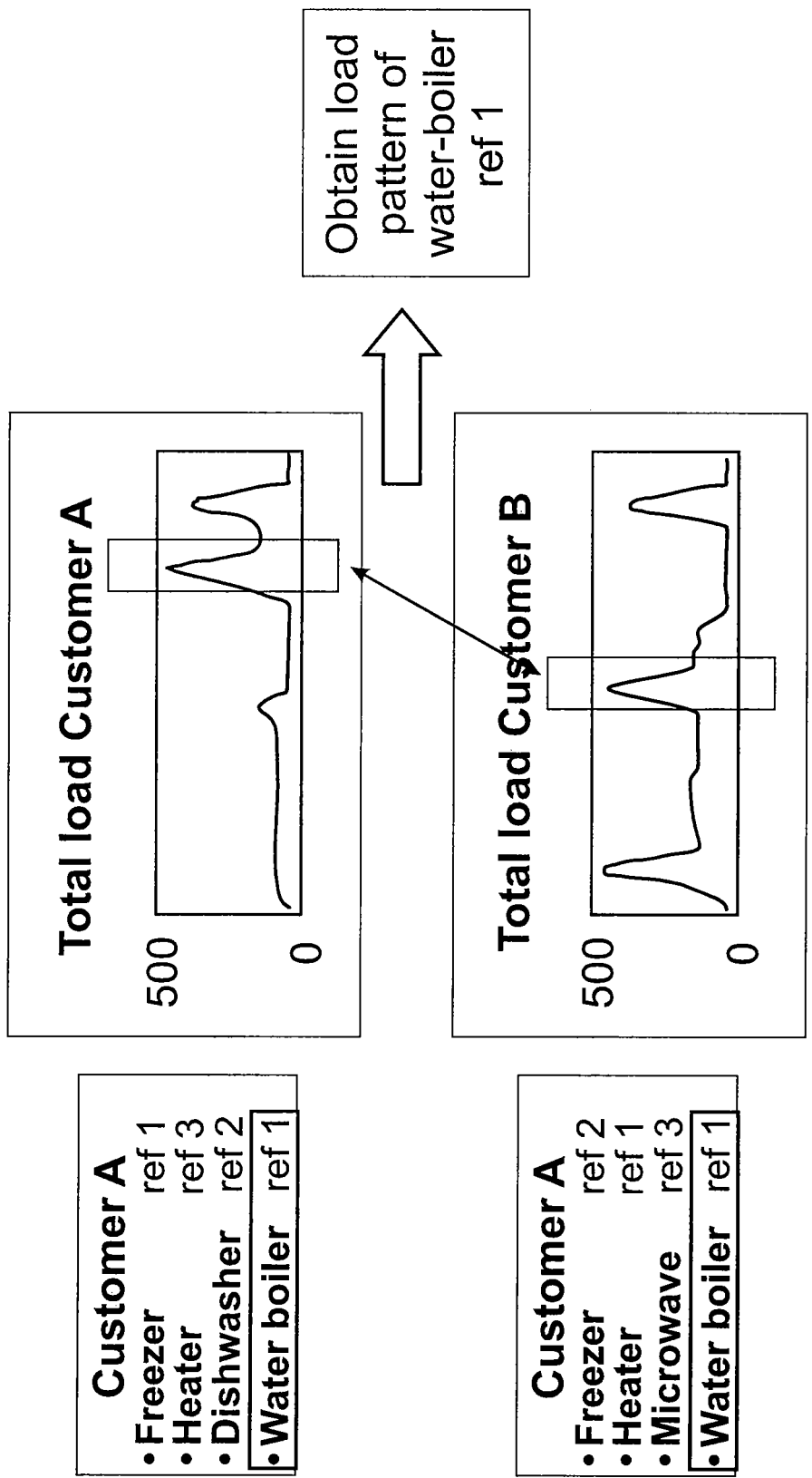
FIG. 9 illustrates an example of generating a load pattern by comparing two customer load profiles.

On the utility side, the analysis of the customer load profile may be used to determine a load pattern for a particular appliance. For example, if two customers have the same appliance, the load profiles for each of the customers may be analyzed to determine a commonly shared load pattern, with one of the customer load profiles being used as a reference load profile. In this way, rather than having to separately sense the load pattern for the particular appliance, the load pattern may be determined by comparing the load profile for two different customers. The database of known profiles may thus be populated more efficiently by analyzing the customer load profiles from two or more customer premises. An example of this is illustrated in FIG. 9. Customer A has a certain set of appliances and certain type of appliances including a freezer (ref 1), a heater (ref. 3), a dish-washer (ref. 2), and a water boiler (ref 1). Customer B has a freezer (ref 2), a heater (ref. 1), a microwave (ref 3), and a water boiler (ref 1). Thus, both Customer A and Customer B have a water boiler of the type ref 1. Total load for Customer A and the total load for Customer B may be compared to determine a common load pattern, as highlighted in FIG. 9. This common load pattern may be attributed to the water boiler of the type ref 1, and may be stored in the load and/or generation patterns library 210. Similarly, the analysis of the customer generation profile may be used to determine a generation pattern for a particular appliance.

The analysis of the customer load profile may also be used to determine which appliances are operating for purposes of demand response. The analysis may be performed in real-time (or near real-time) whereby the real-time customer load profile may be analyzed to determine which appliances are currently operating. Based on the devices that are determined to be operating, demand response may select the appliance to be turned off. In particular, a list may be accessed that includes non-essential appliances that may be turned off using demand response. Or, a list may be accessed that includes essential appliances that may not be turned off using demand response. For example, the analysis may determine that the heater and the dishwasher are currently operating. Demand response may access the one or more lists to determine that the dishwasher (rather than the heater) may be turned off to reduce power consumption. Alternatively, the analysis may be used to develop an operating appliance model, which is a model indicative of the appliances that are operating for the particular customer. For example, the analysis may determine which appliances are operated at various times in a predetermined period (such as in a day, a week, a month, a season, or a year) and populate the model with this information. When demand response seeks to determine which of the particular customer's appliances are operating, demand response may input to the model the particular time (such as 2 PM on a Monday in December) and may receive from the model the appliances that are operating for the particular time. Based on this determination of the appliances that are operating, demand response may determine whether to control the appliance in order to reduce load at the customer premises. In the case of Customer A operating a heater and a dish-washer, and Customer B operating only a heater, demand response may select Customer B for control of the dish-washer (a non-essential appliance). Similarly, the analysis of the customer generation profile may be used to determine how much power is estimated to be generated within a particular period (such as in the next hour) for purposes of how much demand response is necessary. For example, if the central utility may estimate the amount of power generated at various customer premises, the central utility may then estimate an amount necessary to reduce load (such as by 10 MW) through demand response.

The analysis of the customer load profile may further be used to determine the consumption for a particular customer in order to predict future consumption. Utilities typically seek to estimate consumption in order to provide sufficient energy to the power grid and to ensure stability of the power grid. The analysis of the customer load profile may be used to generate a consumption model for the particular customer, thereby allowing for better prediction of consumption for a section of the power grid or the power grid as a whole. Similarly, the analysis of the customer generation profile may be used to determine the generation for a particular customer in order to predict future generation.

The central utility may further analyze the customer energy profile in order to determine whether the customer premises has any generation sources. In the event that a utility worker needs to service the customer premises, information on whether the customer premises has any generation sources (such as a solar panel) that contributes to the line power may be relevant. In particular, even if the power to the customer premises is removed, if the customer premises has a generation source, the utility worker may still be in danger. The disaggregation analysis may thus determine whether the customer premises has any power generation devices to alert the utility worker.

The analysis of the customer load and/or generation profile may be used by the central utility to determine if there is a device at the customer's site that is corrupting the power line (such as making the frequency of the power line deviate outside of specifications).

In addition, the analysis of the customer load and/or generation profile may be used by the central utility for billing purposes. One example may be for usage-based billing schemes. The central utility may charge electricity differently depending on the end-use. For instance, a central utility may charge base-load appliances (i.e. devices which are on all the time) at a lower rate than devices generating bursty load. The reasoning is that baseload-related power usage can be more accurately predicted by the central utility and as such it may correspond to a lower cost-to-serve. Another example may be for energy service-level agreements. The central utility may sell a service for maintaining a pre-agreed level of service (such as maintaining a predetermined temperature at the client premises as opposed to selling a heating/cooling service). As still another example, the central utility may offer a service for replacing appliances based on the disaggregation analysis. In particular, an appliance upgrade may be paid for by the generated energy savings. Based on the demand monitoring data, a central utility may identify customers owning low efficiency refrigerators and offer them the service of replacing one or more devices (such as a refrigerator, heater, lighting, etc.) with a more efficient one against a fixed monthly fee, which is lower than what their old device used to cost them.

Figure 4:
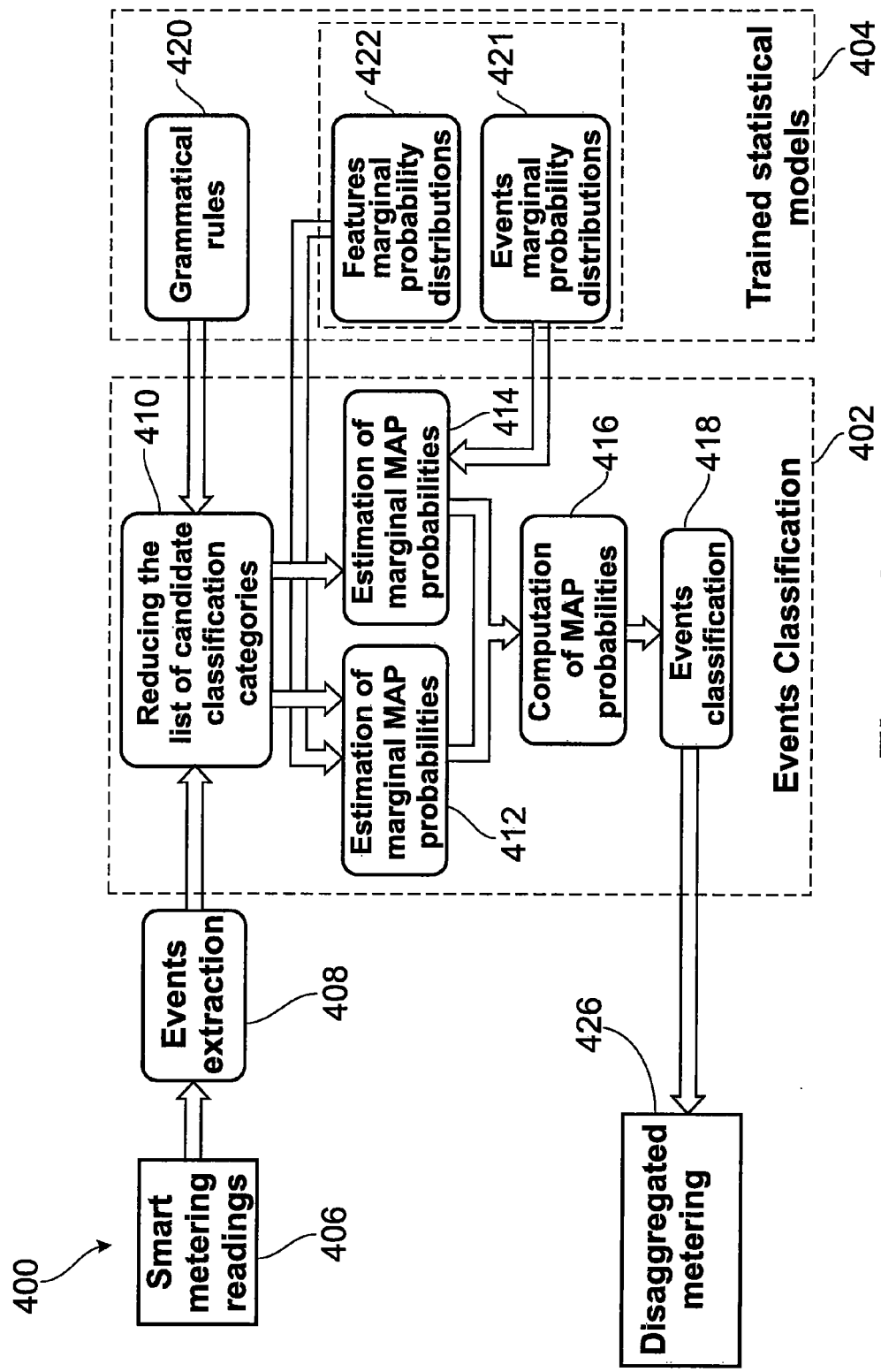
FIG. 4 is a more detailed flow diagram of disaggregating the customer load profile.

FIG. 4 is another example of a flow diagram 400 of disaggregating the customer load profile. As shown at block 402, the Smart Metering Readings are received. One or more events may be extracted from the readings, as shown at block 408. And, the events extracted may be sent to events classification 402 for classifying the events. Events classification 402 includes pruning or reducing the list of candidate classification categories, as shown at block 410. For example, a list of all available candidate classification categories may be reduced to a subset of categories using grammatical rules, as shown at block 420.

In order to determine the events classification, the disaggregation algorithm may use one or more types of statistics, including estimation theory. One type of estimation theory is Bayesian statistics. In Bayesian statistics, a maximum a posteriori (MAP) estimate is a mode of the posterior distribution. The MAP may rely on a priori information obtained about the customer load profile whose parameters the customer premises analytics 202 seeks to estimate. Such a priori information, which may be stored in load and/or generation patterns library 210, may come either from the correct scientific knowledge of the physical process or from previous empirical evidence.

The MAP may be used to obtain a point estimate of an unobserved quantity on the basis of empirical data. It is closely related to Fisher's method of maximum likelihood (ML), but employs an augmented optimization objective which incorporates a prior distribution over the quantity one wants to estimate. MAP estimation may therefore be seen as a regularization of ML estimation.

MAP estimates may be computed in several ways including: (1) analytically, when the mode(s) of the posterior distribution can be given in closed form (such as when conjugate priors are used); (2) via numerical optimization such as the conjugate gradient method or Newton's method (which may require first or second derivatives that may be evaluated analytically or numerically); (3) via a modification of an expectation-maximization algorithm (which does not require derivatives of the posterior density); and (4) via a Monte Carlo method using simulated annealing.

As shown at blocks 412 and 414, the reduced list of candidate classification categories is used for two estimations of marginal MAP probabilities. In particular, trained statistical models 404 may be used to generate the estimations, including one using the features marginal probability distributions (block 422) and another using the events marginal probability distributions (block 424). The two estimations may be used for computation of MAP probabilities (block 416), which in term generates the events classification (block 418), that is used for the disaggregated metering (block 426). Similarly, the disaggregation of the customer generation profile may use Bayesian statistics.

While the method and system has been described with reference to certain embodiments, it will be understood by those skilled in the art that various changes may be made and equivalents may be substituted without departing from the scope. In addition, many modifications may be made to adapt a particular situation or material to the teachings without departing from its scope. Therefore, it is intended that the present method and system not be limited to the particular embodiment disclosed, but that the method and system include all embodiments falling within the scope of the appended claims.

For example, the computer-readable medium as discussed above may be a single medium, or the computer-readable medium may be a single medium or multiple media, such as a centralized or distributed database, and/or associated caches and servers that store one or more sets of instructions. The term "computer-readable medium" may also include any medium that may be capable of storing, encoding or carrying a set of instructions for execution by a processor or that may cause a computer system to perform any one or more of the methods or operations disclosed herein.

The computer-readable medium may include a solid-state memory such as a memory card or other package that houses one or more non-volatile read-only memories. The computer-readable medium also may be a random access memory or other volatile re-writable memory. Additionally, the computer-readable medium may include a magneto-optical or optical medium, such as a disk or tapes or other storage device to capture carrier wave signals such as a signal communicated over a transmission medium. A digital file attachment to an e-mail or other self-contained information archive or set of archives may be considered a distribution medium that may be a tangible storage medium. Accordingly, the disclosure may be considered to include any one or more of a computer-readable medium or a distribution medium and other equivalents and successor media, in which data or instructions may be stored.

Alternatively or in addition, dedicated hardware implementations, such as application specific integrated circuits, programmable logic arrays and other hardware devices, may be constructed to implement one or more of the methods described herein. Applications that may include the apparatus and systems of various embodiments may broadly include a variety of electronic and computer systems. One or more embodiments described herein may implement functions using two or more specific interconnected hardware modules or devices with related control and data signals that may be communicated between and through the modules, or as portions of an application-specific integrated circuit. Accordingly, the present system may encompass software, firmware, and hardware implementations.

While the invention is described in the foregoing context, it is not meant to be limiting, as those of skill in the art will appreciate that the acts and operations described may also be implemented in hardware. Accordingly, it is the intention of the Applicant to protect all variations and modification within the valid scope of the present invention. It is intended that the invention be defined by the following claims, including all equivalents.

The invention claimed is:

1. A system for detecting activation of at least one appliance of a plurality of appliances of different types, the system comprising:
 a plurality of customer premises, each of the customer premises comprising:
  a sensor configured to generate a customer load profile indicating an overall load of the plurality of appliances; and
  communication functionality for communicating the customer load profile to a utility management system, and
 the utility management system configured to:
  receive the customer load profile from the sensor;
  compare at least part of the customer load profile with a reference pattern corresponding to each of the at least one appliance;
  determine, based on the comparison, for a predetermined time period, times in which the each of the at least one appliance is operating at the customer premises;
  determine an amount of electricity used by the at least one appliance during the predetermined period;
  determine a modified operation of the at least one appliance;
  determine a modified amount of electricity the at least one appliance would use in the modified operation during the predetermined period; and
  communicate both the amount and the modified amount to the customer premises for comparison.

2. The system of claim 1, wherein the utility management system further comprises at least one database for storing the reference pattern; and wherein the utility management system uses the at least one database in order to disaggregate the customer load profile into a subset of loads and to identify the one or more appliances operating at the customer premises.

3. The system of claim 2, wherein the reference pattern comprises a known load pattern, the known load pattern being correlated to an appliance; wherein the utility management system compares at least a part of the known load pattern with at least a part of the customer load profile.

4. The system of claim 3, wherein the customer load profile comprises a customer electricity load profile; and wherein the utility management system determines one or more electrical appliances that are operating at the customer premises.

5. The system of claim 4, wherein the utility management system further comprises a feature extractor to extract one or more features from the customer load profile.

6. The system of claim 5, wherein the one or more features comprises "on"/"off" steps, events time-pattern, and steady state variations; and wherein the utility management system further comprises a pattern recognition engine, the pattern recognition engine using the one or more features in order to determine which appliance is operating at the customer premises, the pattern recognition engine comparing the one or more features with one or more features of known load patterns.

7. The system of claim 1, wherein the utility management system is further configured to:
 determine a cost of the amount and a modified cost of the modified amount; and
 communicate the cost and modified cost to the customer premises.

8. The system of claim 1, wherein the utility management system generates an operating appliance model based on the times in which the each of the at least one appliance is operating at the customer premises, the operating appliance model receiving input of a selected time and generating an output indicative of which appliances are operating at the selected time.

9. The system of claim 8, wherein the utility management system further comprises a demand response system; and wherein the demand response system receives as input the appliances operating at the customer premises at the selected time.

10. The system of claim 1, wherein the customer premises further comprises a generation sensor configured to provide a customer generation profile indicative of electricity generated at the customer premises; and wherein the utility management system is further configured to determine, based on the customer generation profile, whether one or more generators are.

11. The system of claim 10, wherein the utility management system further determines how much power is generated by the one or more generators that are active.

12. A method for detecting activation of at least one appliance of a plurality of appliances of different types, comprising:
receiving by a utility management system a customer load profile, the customer load profile being generated by sensor monitoring an overall load drawn by the plurality of appliances to provide the customer load profile indicating the monitored overall load of the appliances at a customer premises;
comparing by the utility management system at least part of the customer load profile with a reference pattern corresponding to each of the at least one appliance;
determining by the utility management system, based on the comparison, for a predetermined time period, times in which the each of the at least one appliance is operating at the customer premises;
determining by the utility management system an amount of electricity used by the at least one appliance during the predetermined period;
determining by the utility management system a modified operation of the at least one appliance;
determining by the utility management system a modified amount of electricity the at least one appliance would use in the modified operation during the predetermined period; and
communicating by the utility management system both the amount and the modified amount to the customer premises for comparison.

13. The method of claim 12, further comprising;
determining a cost of the amount and a modified cost of the modified amount; and
communicating the cost and modified cost to the customer premises.

14. The method of claim 12, further comprising generating an operating appliance model based on the times in which the each of the at least one appliance is operating at the customer premises, the operating appliance model receiving input of a selected time and generating an output indicative of which appliances are operating at the selected time.

15. The method of claim 14, wherein the utility management system further comprises a demand response system; and further comprising receiving, by the demand response system, as input the appliances operating at the customer premises at the selected time.

16. The method of claim 12, further comprising:
receiving a customer generation profile indicative of electricity generated at a customer premises; and
determining, based on the customer generation profile, whether one or more generators are active.

17. The method of claim 16, further comprising determining how much power is generated by the one or more generators that are active.

18. A utility management system for detecting activation of at least one appliance of a plurality of appliances of different types, comprising:
an interface configured to receive a customer load profile and a customer generation profile, the customer load profile being generated by sensor monitoring of an overall load drawn by the plurality of appliances to provide the customer load profile indicating the monitored overall load of the appliances at a customer premises, the customer generation profile indicative of electricity generated at the customer premises; and
at least one processor in communication with the interface and configured to:
compare at least part of the customer load profile with a reference pattern corresponding to the at least one appliance;
determine, based on the comparison, for a predetermined time period, times in which the at least one appliance is operating at the customer premises; and
determine, based on the customer generation profile, whether one or more generators are active at the customer premises.

19. The system of claim 18, wherein the processor is further configured to:
determine a modified operation of the appliance;
determine a modified amount of electricity used by the appliance in the modified operation; and
send the modified amount to the customer premises.

20. The system of claim 18, wherein the processor is further configured to generate an operating appliance model based on the times in which the each of the at least one appliance is operating at the customer premises, the operating appliance model receiving input of a selected time and generating an output indicative of which appliances are operating at the selected time.

21. The system of claim 18, wherein the processor is further configured to
identify a specific model of a generator; and
determine whether the power generator is faulty by comparing an amount of power generated by the specific generator with a predetermined amount of power expected to be generated by the specific generator.

22. A utility management system for detecting activation of at least one appliance of a plurality of appliances of different types, comprising:
an interface configured to receive a customer load profile, the customer load profile being generated by sensor monitoring an overall load drawn by the plurality of appliances to provide the customer load profile indicating the monitored overall load of the appliances at a customer premises; and
at least one processor in communication with the interface and configured to:
compare at least part of the customer load profile with a reference pattern corresponding to each of said at least one appliance,
determine, based on the comparison, whether at least one the appliances is active;
determine a modified operation of the at least one of the appliances;
determine a modified amount of electricity used by the at least one of the appliances in the modified operation; and
communicate, via the interface, the modified amount to the customer premises.

* * * * *